United States Patent
Bauer et al.

(10) Patent No.: US 6,691,127 B1
(45) Date of Patent: Feb. 10, 2004

(54) STORAGE AND RETRIEVAL OF PROCESS CAPABILITY AND GUIDANCE INFORMATION, AND COMPUTER MEDIA THEREFOR

(75) Inventors: Lowell Wilson Bauer, Niskayuna, NY (US); Marc Thomas Edgar, Clifton Park, NY (US); Gene Edward Wiggs, Chester, OH (US); Thomas Randolph Campbell, Washington, CT (US)

(73) Assignee: General Electric Company, Niskayuna, NY (US)

( * ) Notice: Subject to any disclaimer, the term of this patent is extended or adjusted under 35 U.S.C. 154(b) by 418 days.

(21) Appl. No.: 09/708,390

(22) Filed: Nov. 9, 2000

(51) Int. Cl.[7] .............................. G06F 17/00; G06F 7/00
(52) U.S. Cl. ...................................................... 707/102
(58) Field of Search ............................... 707/3, 10, 100, 707/102, 201; 345/964, 708, 709; 700/110; 714/100; 705/1

(56) References Cited

U.S. PATENT DOCUMENTS

| | | | | |
|---|---|---|---|---|
| 5,339,247 A | * | 8/1994 | Kirihara et al. | 700/106 |
| 5,452,218 A | | 9/1995 | Tucker et al. | 700/110 |
| 5,581,466 A | * | 12/1996 | Van Wyk et al. | 700/95 |
| 5,991,528 A | * | 11/1999 | Taylor et al. | 703/6 |
| RE36,602 E | * | 3/2000 | Sebastian | 364/468.03 |
| 6,262,730 B1 | * | 7/2001 | Horvitz et al. | 345/707 |
| 6,366,824 B1 | * | 4/2002 | Nair et al. | 700/115 |
| 6,466,927 B1 | * | 10/2002 | Dougherty et al. | 706/45 |

* cited by examiner

Primary Examiner—Greta Robinson
Assistant Examiner—Susan Rayyan
(74) Attorney, Agent, or Firm—Penny A. Clarke; Patrick K. Patnode

(57) ABSTRACT

In a system and method for saving and retrieving process capability and guidance information related to supporting product design and manufacturing activities, specific capability and guidance information related to sets of standardized product attributes are collected and stored as a plurality of records in a database. A user may then access the database through a suitable computer program interface and design a product using any combination of standardized attributes. Upon each attribute selection, the system queries the database and retrieves the process capability and guidance information associated with the received set of attributes. This information is then displayed to the user to assist in product design and manufacturing activities. Users may also group information retrieved relating to various sets of attributes and generate composite checklists including ranked listings of relevant guidance information. Users are thus enabled to view and reference a previously unavailable quantity of information specifically related to the product being designed or manufactured.

23 Claims, 7 Drawing Sheets

STORAGE AND RETRIEVAL OF PROCESS CAPABILITY AND GUIDANCE INFORMATION, AND COMPUTER MEDIA THEREFOR

BACKGROUND OF THE INVENTION

This invention relates generally to product design, production and life management activities and, more particularly, to a comprehensive tool for supporting such activities to enable effective and efficient manufacture of products designed therewith.

The product manufacturing process conventionally includes at least a design phase and a production phase. During the design phase, the product to be manufactured is designed based upon the desired end use, known limitations associated with the product, such as physical and structural limitations, and process limitations related to the ability to produce the product. After the product has been designed, the production phase begins in which the product must be manufactured in accordance with the design as well as in an efficient and effective manner. The design and production processes often include time-consuming and inefficient procedures such as trial and error design, extensive product testing, and time-intensive manual research into product and material specifications and into previously developed design and process guidance information. Such processes adversely impact production of quality products in an efficient manner, and can result in manufacture of defective or inferior products.

Several methods and systems for supporting product design activities to alleviate the above-described problems are known in the art. For example, U.S. Pat. No. 5,452,218 to Tucker et al. describes a system for determining quality levels for fabrication and assembly designs using information stored in a computer database. Using the information in the database and user supplied information, the system generates a worksheet that models the manufactured product. Prospective defects and design problems are then illuminated to prevent their inclusion in the final design.

Known design and production support systems such as that described by Tucker et al. are often limited in the type and content of information provided to the user for assisting the user in designing and producing the desired product. Although the system of Tucker et al. provides a user with a statistical analysis of the process entered by the user, it does not otherwise assist the user in designing an acceptable product and process for manufacturing the product.

It would therefore be desirable to improve the convenience and efficiency of the design and production process by providing a comprehensive tool, interactive with a user, for producing design and manufacturing process guidance information and process capability information directed toward specific design and production processes.

BRIEF SUMMARY OF THE INVENTION

The limitations noted above are overcome by providing a method and system for saving and retrieving guidance information related to supporting product design and manufacturing activities. Specific process capability information and guidance information related to sets of standardized product attributes are collected and stored in a database. A user may then access the database through a suitable interface and design a product using any combination of standardized attributes. Upon each attribute selection, the system queries the database and retrieves the process capability information and/or guidance information associated with the received set of attributes. This information is then displayed to the user to assist in product design and manufacturing activities. The user may also group information retrieved relating to various attribute collections and generate composite checklists including ranked listings of relevant guidance information related to group. By employing this method and system for collecting, storing and retrieving process capability and guidance information related to product design and manufacturing activities, system users can view and reference a previously unavailable quantity of information specifically related to the product being designed/manufactured.

DETAILED DESCRIPTION OF THE INVENTION

Figure 1:
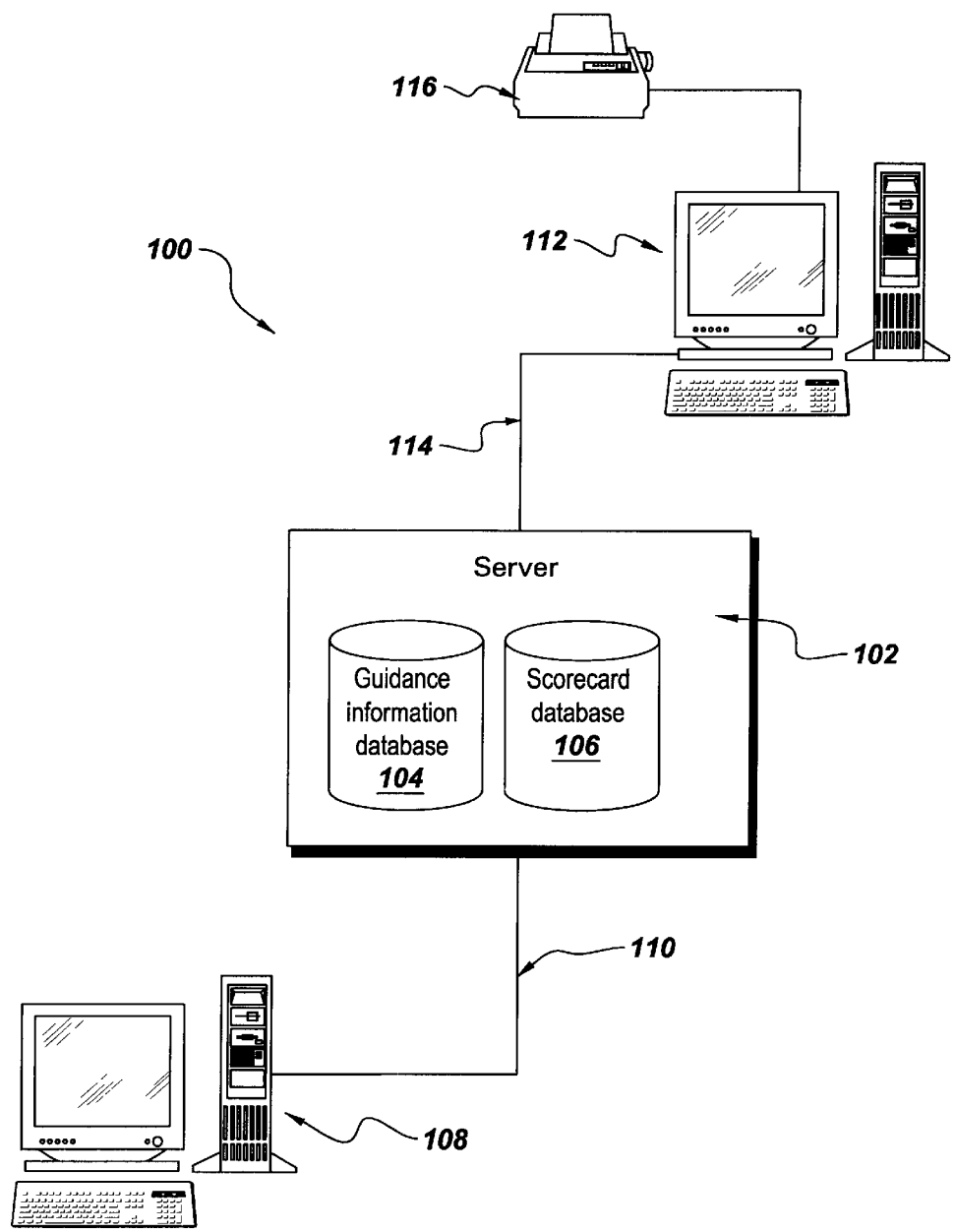
FIG. 1 is a schematic diagram of a preferred embodiment of the invention for providing comprehensive design and production guidance information to a product designer from a remote location.

FIG. 1 schematically shows a system 100 (in the form of computer architecture) for providing comprehensive design and production guidance information to a product designer from a remote location, in accordance with the preferred embodiment. System 100 comprises a server 102 for maintaining the design and production guidance information in a manner which facilitates authorized access and retrieval. Preferably server 102 includes at least a guidance information database 104 and a scorecard database 106. System 100 also includes at least one information entry computer 108 coupled to server 102 over a computer network 110. Network 110 may be any conventional computer network such as a wide area network (WAN), area network (LAN), or an open network such as the Internet. Information in entry computer 108 is preferably provided with a suitable software application for enabling a user to populate database 104 by uploading thereto, or otherwise transmitting, relevant guidance information for subsequent retrieval by product designers and manufacturers.

A user computer 112 is also coupled to server 102 over a computer network 114. Network 114 may be the same network as network 110, although the invention is not limited to this embodiment. Therefore, while information entry computer 108 may be connected to server 102 via a LAN 110, user computer 112 may be connected to server 102 via the Internet 114. User computer 112 is provided with a suitable software application for enabling a user to access and retrieve information contained in guidance information database 104. By having connectivity to server 102 across computer network 114, a user is able to access information contained in a remote location. Preferably, an output device such as a printer 116 is coupled to user computer 114 to enable the user to print out any information obtained from database 104 for subsequent reference. User computer 112 and information entry computer 108 can be the same computer.

Guidance information database 104 can be populated with all relevant guidance information. Relevant information is compiled and organized to correspond to a standardized set of design and process attributes. Each collection of design and process attributes relating to a particular part or process is then recorded in a database record. The records are then uploaded onto guidance information database 104 of server 102 over network 110 for subsequent access by system users. Alternatively, data can be entered directly into guidance information database 104.

Figure 2:
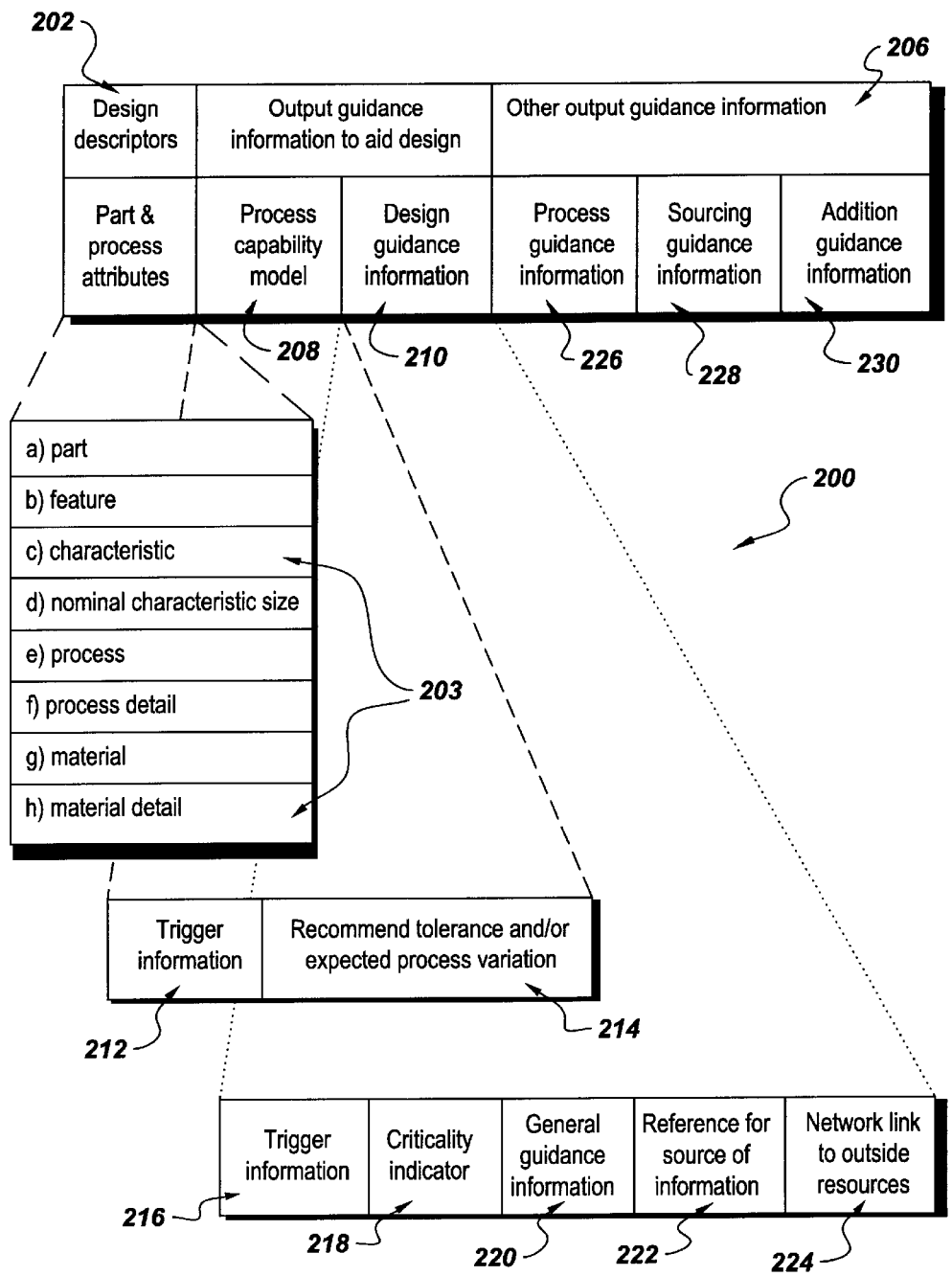
FIG. 2 illustrates the data structure of a suitable database record for use with the preferred embodiment.

One example of a suitable database record is shown in FIG. 2. Database record 200 includes a plurality of data fields, each of which may be compartmentalized into subfields. Each field or sub-field includes at least one entry, or set of entries, corresponding to a particular part or process attribute or combination of attributes. Suitable data fields include: a design descriptors field 202 for containing the values corresponding to the standardized set of part and process attributes; an output guidance information field 204 including information for aiding product design; and an output guidance information field 206 including information for aiding in other areas of production such as the manufacturing process and sourcing.

As shown in FIG. 2, design descriptors field 202 includes a plurality of sub-fields 203, each containing the value of a particular part and process attribute. Output guidance information field 204 is further likewise broken down into sub-fields 208 and 210 containing information relating to a process capability model for the particular part described by the record and detailed design guidance information for particular combinations of attributes, respectively. Sub-field 208 is further broken into sub-fields 212 and 214 containing process capability model trigger information and output information relating to the recommended tolerance and/or expected process variation associated with the product described by the record. Generally, the process capability model output information will not be displayed until each of the attributes corresponding to the particular product have been selected. In other words, the trigger attributes identified in sub-field 212 will simply include all available attributes. However, this is not a necessary limitation of the invention and the system may be designed to provide the process capability model information to a user upon selection of any desired set of attributes.

Sub-field 210 relating to the detailed design guidance information is broken down into sub-fields 216, 218, 220, 222 and 224, each of which includes different types of guidance information. Although only a single set of sub-fields 216–224 is shown in FIG. 2, it should be understood that a separate set of such sub-fields is preferably required for each particular piece of guidance information. Thus the field and sub-fields described herein are merely descriptive of the types of information contained therein and are not meant to limit the number of actual fields contained in the record. Sub-field 216 includes trigger information relating to a particular piece of guidance information. For example, although the selection of each attribute is required to view the process capability model associated with a particular product described in the record, the system of the invention is designed to provide product designers with guidance information at various stages of product design not merely at the end stage. Therefore, guidance information associated with the selection of any predetermined group of attributes may be provided as those attributes are selected, without requiring the user to select all the product attributes. By enabling product database records to be queried without a designation of all product attributes, designers may build a composite checklist of guidance information relating to a new product design wherein the checklist of information is built upon information compiled during the design of other products.

Sub-field 218 includes a criticality indicator which enables the system 100 to rank the guidance information in a manner helpful to a product designer. Sub-field 220 includes the general guidance information which is displayed to the system user upon selection of the corresponding trigger attributes. This information typically includes recommendations and limitations with respect to sizes, feature locations, process steps, etc. Sub-field 222 includes reference information relating to the particular guidance information provided in sub-field 220. This may be a technical reference, prior experimentation results, published articles, date of data entry, etc. Sub-field 224 includes a network link, e.g., a hyperlink, to relevant outside resources which may further aid a designer in making appropriate design choices.

Although each field and sub-field in a given record 200 may be populated with information, this is not required for operation of the system. In many instances, the reference information and outside link sub-fields 222 and 224 may be unpopulated, while guidance information is provided in sub-field 220; that is, not all information must be provided for the record to be properly recorded in the database and accessible to system users. However, sub-fields including necessary information such as product attribute values, trigger information, and process capability model output information should be populated in the record.

Other output guidance information field 206 may be broken down into any number of specific sub-fields relating to additional phases of the design and manufacturing process. As shown in FIG. 2, these sub-fields may include a process guidance information sub-field 226 for including information aiding in the manufacturing of a particular product, a sourcing guidance information sub-field 228 for aiding a product scheduler in sourcing the manufacture of a particular product, and an additional guidance information sub-field 230 for including miscellaneous additional guidance information. Although not shown in the interest of brevity, each of sub-fields 226–230 may further include sub-fields similar to those described above for including detailed guidance information on the respective operation being performed.

Once a plurality of product records have been uploaded to database 104 (FIG. 1) in the manner described above, a system user can log in to the system and retrieve guidance information relating to product attributes selected by the user. The flow chart of FIG. 3 describes a method for retrieving guidance information from system 100 of FIG. 1. At step 300 a user logs in to the system through any conventional means, thereby establishing a connection between user computer 114 and server 102 through network 112. The phrase "log in", in the context of this application, is intended to include any request for access to the system by a user, whether locally or across a computer network; that is, "log in" refers both to authenticated systems which may require a username and password, as well as to systems wherein a user merely powers up a computer and establishes access to the server. In a preferred embodiment, an authorized user can connect to server 102 and use the guidance information retrieval system across network 114. Retrieved material is generally summarized in scorecards and/or checklists and can be saved locally on user computer 112, on server 102, or elsewhere on the network, for subsequent access.

Users, having logged in to the system, can indicate, at step 302, whether they wish to access a prior design or wish to begin a new design. A user indicating a wish to review or modify an old design is forwarded to step 500 in FIG. 5, described in detail below. However, if the user indicates a wish to establish a new design on the system, the system, at step 303, displays a list of options regarding the type of guidance information the user wishes to view. This list preferably includes the various types of guidance information stored in records 200 (FIG. 2), such as design guidance information, manufacturing process guidance information and sourcing guidance information. Additional types of guidance information may also be stored in records 200 and selected from the option list at step 303. In the interest of brevity, the following description tracks a design guidance information selection; however, other types of guidance information may be queried, retrieved and displayed in a manner similar to that described below. Once the user has selected the design guidance information option at step 303, the system proceeds to step 304 where an attribute entry/presentation screen is displayed. (If the user had chosen another type of guidance information, a similar attribute entry/presentation screen suitable to the selected type of information would be displayed.) One exemplary embodiment of a completed attribute entry/presentation screen 600 is shown in FIG. 6. Details of this embodiment are referred to throughout the following description.

Attribute entry/presentation screen 600 preferably includes at least a plurality of attribute pull-down menus 602, each menu being uniquely associated with the various product attributes included in each database record 200 (FIG. 2). Each of the various menus 602 follows a "drill-down" methodology, wherein the options available on each menu are affected by selections made on related menus, i.e., are context sensitive. In this manner, a designer entering product design attributes can successively narrow down the various attributes relevant to a particular design. By limiting the choices available in each menu based upon previously selected attributes, the designer can avoid pairing incompatible attributes and thereby more easily and quickly "drill-down" to a permissible and functional design.

With reference again to FIG. 3, once the system, at step 304, has displayed the attribute entry/presentation screen to the user, the system proceeds to step 306 where it receives one of the product/design attributes available from one of the above-described pull down menus 602. At this point, the system determines, at step 308, whether more than one product attribute has been received by the system; that is, the system determines whether the user has selected more than one attribute from the various pull-down menus 602. If so, the system proceeds to step 400 in FIG. 4, otherwise, the system continues to step 310 where it receives an additional attribute. The system then returns to step 308 where it is determined that more than one attribute has been received.

Figure 3:
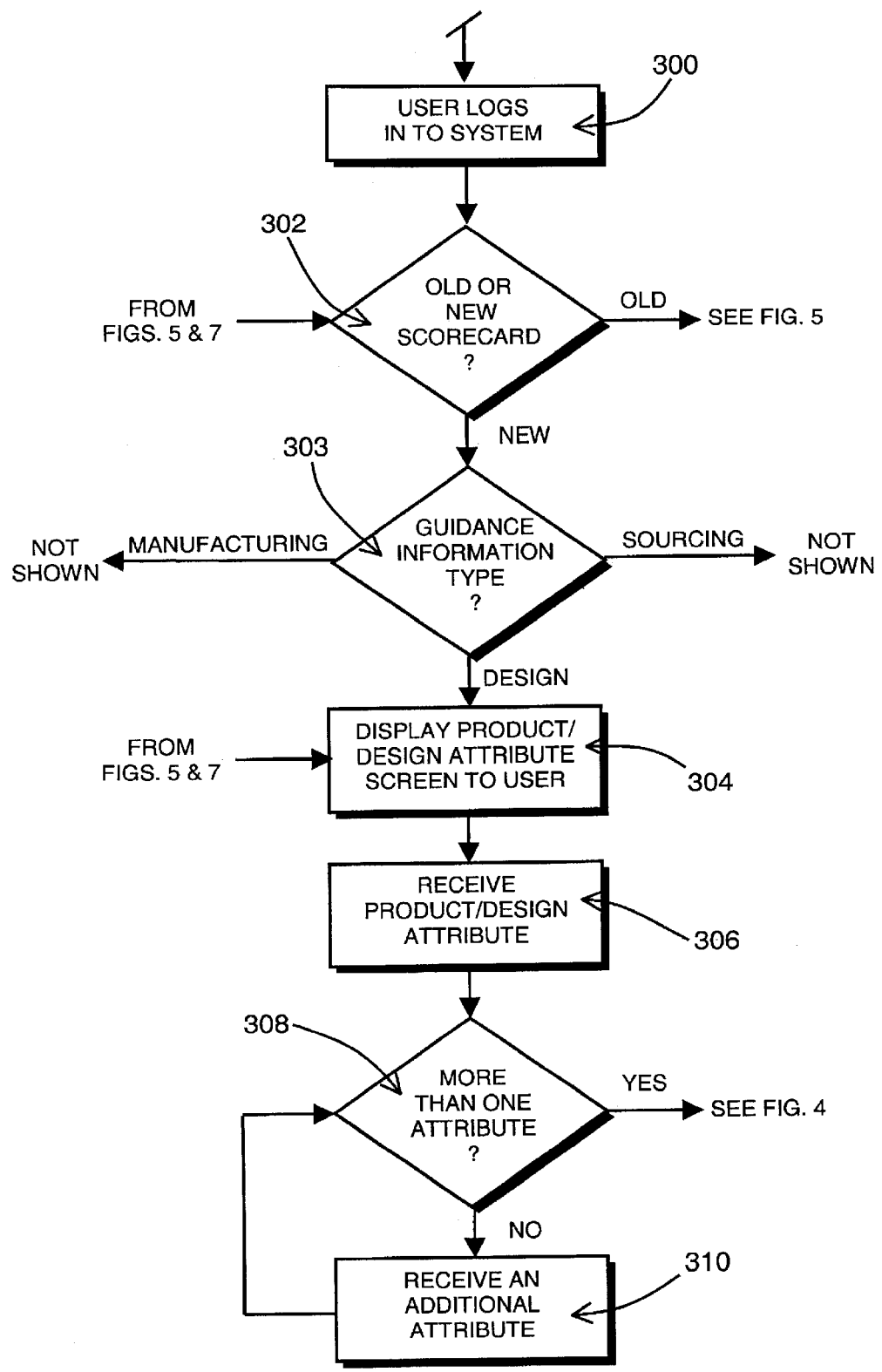
FIG. 3 is a flow chart of a process for retrieving guidance information in accordance with the preferred embodiment.
Figure 4:
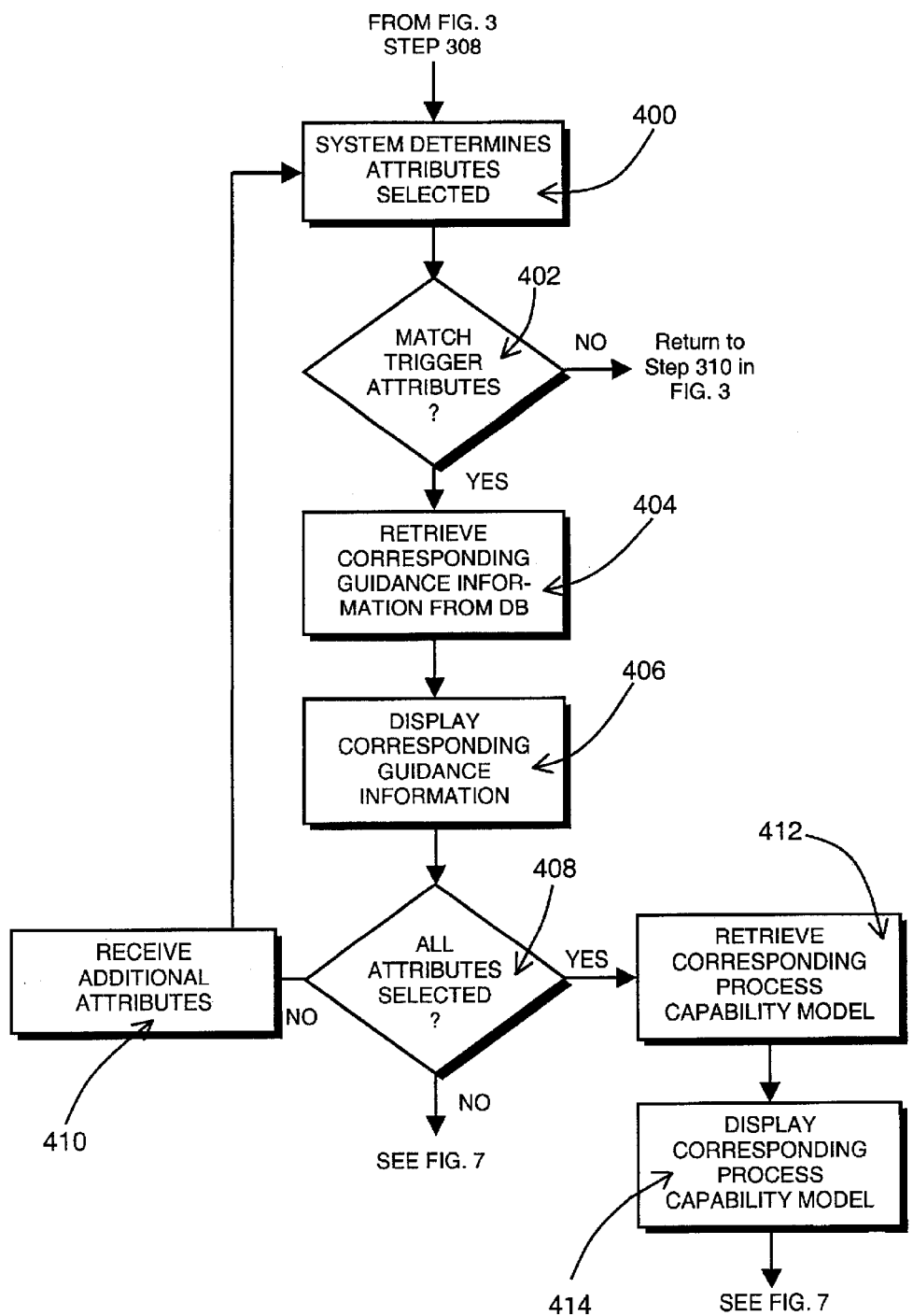
FIG. 4 is a flow chart extension of FIG. 3 further describing the process for retrieving guidance information of the preferred embodiment.

In FIG. 4, at step 400, the system determines which attributes have been received. At step 402, the system queries database 104 (FIG. 1) and determines whether the received collection of attributes match any set of trigger attributes stored in the various product records 200. If not, the system returns to step 310 in FIG. 3 to receive additional product/design attributes. However, if the system finds a matching set of trigger attributes, the system continues to step 404 to retrieve the guidance information associated with the received set of attributes, provided that the matching guidance information has not previously been retrieved. It should be understood that, although the user has selected to display a particular type of guidance information in step 303, the system does not limit its query and retrieval to this selected type of information; that is, although design guidance information is requested, additional types of guidance information such as manufacturing process and sourcing guidance information are also retrieved to enable subsequent review of all types of guidance information associated with the entered product attributes. The chosen type of information is then displayed to the user at step 406. In this manner the retrieved design guidance information is shown immediately upon receipt of an associated set of attributes.

As shown in FIG. 6, the attribute entry/presentation screen includes guidance information output regions 604, 606 and 608. In region 604, the general design guidance information contained in sub-field 220 of record 200 (FIG. 2) is displayed to the user as it is retrieved from database 104 (FIG. 1). Region 606 includes any links to outside resources which may have been contained in sub-field 224 of record 200. In region 608, the reference materials associated with the retrieved guidance information and contained in sub-field 222 of record 200 are displayed to the user. By displaying retrieved guidance information upon the selection of all relevant attributes, the invention enables the user to quickly and accurately ascertain the information necessary to ensure error-free design of the product. Although the scorecard represented by screen 600 in the present example displays design guidance information, a similar type of scorecard disclosing any of the other types of guidance information would be displayed upon selection of that type of output information at step 303 (FIG. 3).

Following display of the guidance information to the user at step 406 in the flow chart of FIG. 4, the system determines, at step 408, whether all attributes necessary to retrieve a process capability model associated with the designed product have been received. If not, the user is enabled to either supply to the system additional product/design attributes at step 410, or continue to scorecard review and saving as shown in detail in FIG. 7. However, if the system determines that all attributes necessary to retrieve a process capability model associated with the designed product have been received, the system, at step 412, retrieves the process capability model output information corresponding to the received attributes and stored in sub-field 214 of record 200 (FIG. 2). This process capability model output information generally includes a recommended expert tolerance and/or expected process variation (e.g., standard deviation, defects per million units, etc). This is the final item of output guidance information available for any particular product and typically results from a combination of all available product/design attributes related to a particular product (e.g., precise selection of all attributes a) through h) in sub-field 202 of record 200). The retrieved process capability model information is then displayed to the user at step 414. As shown in FIG. 6, the process capability model information is displayed in a region 610 of the attribute entry/presentation screen 600. Following display of the process capability model information the system advances to the operation shown in FIG. 7.

Figure 7:
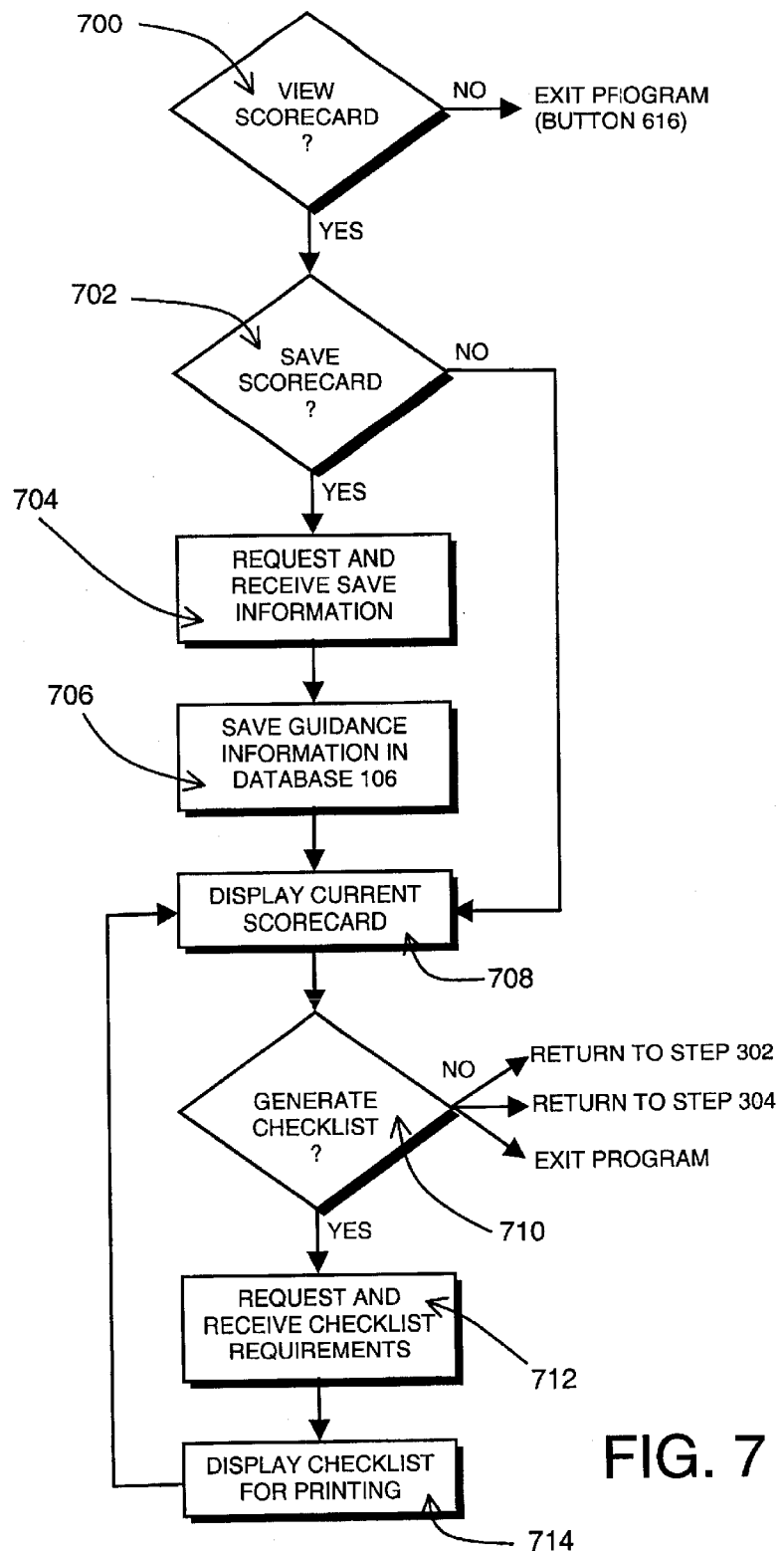
FIG. 7 is a flow chart describing a method for saving scorecard information and generating a guidance information checklist in accordance with the preferred embodiment.

At any time during the selection of product/design attributes or after display of the process capability model information, the attributes entered and the guidance information retrieved may be displayed to the user as a product/design scorecard in the manner set forth in FIG. 7. The scorecard is generally presented in a format suitable for printing by the user on printer 116 (FIG. 1). Further, although the information displayed to a user on any individual presentation screen (or product/design scorecard) 600 is extremely useful for aiding the user in a particular part of the design process, the system also provides users with ability to compile extensive amounts of related guidance information for use throughout the design and manufacturing process of a particular product.

As shown in FIG. 6, each attribute entry/presentation screen 600 preferably includes a pair of buttons 612 and 614 for enabling a user to save the information obtained up to that point and/or view the current product/design scorecard including all the retrieved information. Because guidance information relating to a set of attributes which have been sufficiently "drilled down" to a particular product feature is likely to be very narrow, a group of attribute sets may be collected in a composite group including all design features of a product. This composite set includes attribute sets and corresponding guidance information relating to each of the product's many feature/characteristic groupings.

FIG. 7 is a flow chart illustrating a method for viewing and saving scorecard information and generating a product checklist in accordance with the invention. A user that has entered all desired attributes into attribute entry/presentation screen 600 is confronted with a decision, at step 700, of whether to view a scorecard or exit the system. To exit the system, the user selects button 616 and terminates the program. However, to view a product/design scorecard, the user must decide, at step 702, whether to save the scorecard as a new product or with an existing product group, or whether to merely view the scorecard without saving it. If the user selects button 614, the system jumps to step 708, where the current scorecard is displayed by the system. However, by selecting button 612, the system proceeds to step 704 where it requests and accepts product grouping and saving information relating to the present scorecard. The selected attributes and associated guidance information are then saved, at step 706, under the selected product grouping in database 106 on server 102 (FIG. 1). The selected attributes and associated guidance information may alternatively be saved locally on user computer 112, or elsewhere on the network. The guidance information saved to database 106 includes not only the presently displayed guidance information but also guidance information relating to design/production phases not presently selected (e.g., manufacturing, sourcing, etc.).

Following the step of saving 706, the current scorecard, at step 708, is displayed to the user for printing on printer 116. Once a scorecard has been displayed, the user must decide, at step 710, whether to generate a product checklist relating to any particular set of design/production phases. A checklist generated in this manner utilizes the criticality indicators stored in sub-field 218 of records 200 (FIG. 2) to rank the guidance information relating to particular product phases and display the information in an easy to follow checklist, thereby ensuring accurate following of the associated instructions. For example, a user wishing to manufacture a previously designed product may request that the system generate a manufacturing checklist including a prioritized ranking of all guidance information relating to the manufacturing process of a particular product, which the user may check off as each condition is met. Similarly, a checklist may be generated including a prioritized ranking of all sourcing guidance information to assist the user in sourcing a particular product. Likewise, a comprehensive checklist of all guidance information associated with a product may also be generated.

If a user decides to generate a checklist the system proceeds to step 712 where details relating to the type of checklist that the user wants to generate are requested and received. At step 714, the system generates and displays the desired checklist using the associated scorecard information stored in database 106. Upon review or printing of the checklist, the user is returned to a display of the current scorecard. A user that decides, at step 710, not to generate a product checklist, is given the option to 1) return to step 302 (FIG. 3) to begin a new design or edit or review an old design, 2) return to step 304 to add or modify attributes in the existing scorecard, or 3) exit the program.

Figure 5:
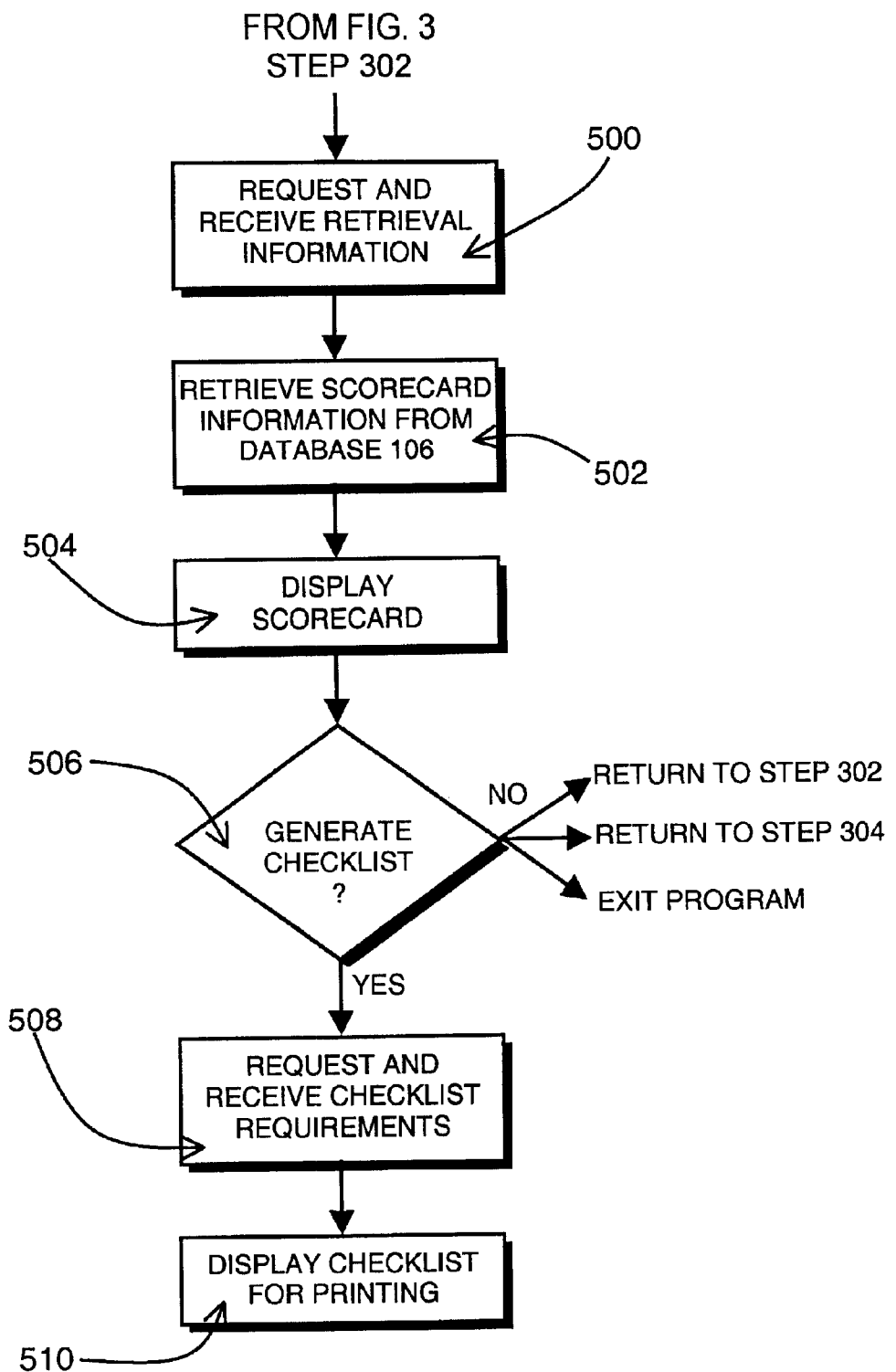
FIG. 5 is a flow chart extension of FIG. 3 describing a process for retrieving prior scorecard information in accordance with the preferred embodiment.
Figure 6:
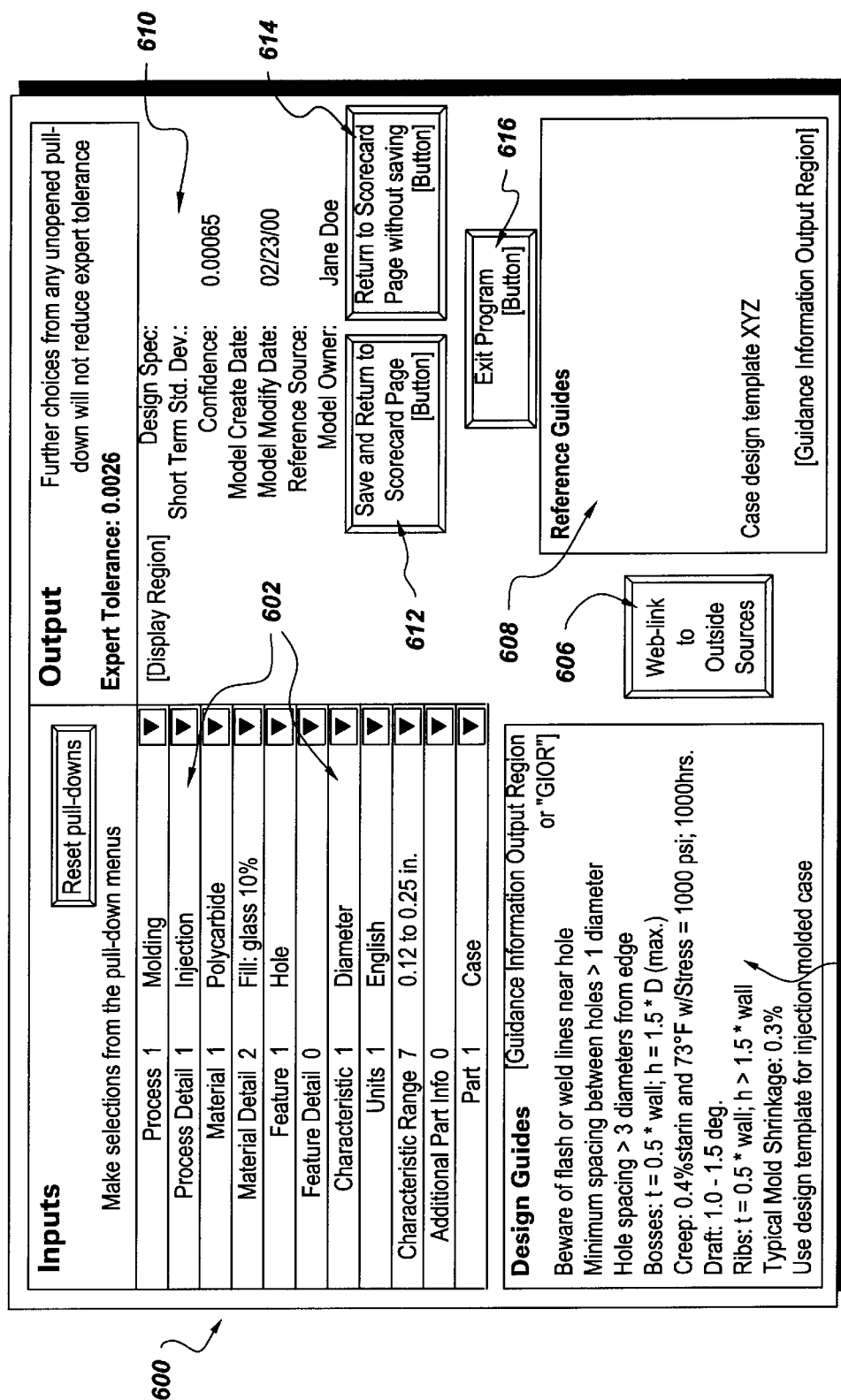
FIG. 6 illustrates an example of a attribute entry/presentation screen in accordance with the preferred embodiment.

When a user chooses to review or modify a prior product design rather than create a new design at step 302, the system proceeds to step 500 of FIG. 5 where scorecard retrieval information is requested and received. The user may then select from any prior scorecards saved in database 106 as well as select the type of guidance information to review (e.g., design, manufacturing, sourcing, etc.) in the manner described above. Once this information has been received, the system, at step 502, retrieves the prior scorecard information and, at step 504, displays the corresponding scorecard to the user.

Once a scorecard has been displayed, the user must, at step 506, decide whether to generate a product checklist relating to any particular set of design/production phases. If the user decides to generate a checklist, the system proceeds to step 508 where details relating to the type of checklist the user wants to generate are requested and received. At step 510, the system generates and displays the desired checklist using the associated scorecard information stored in database 106. A user that decides, at step 506, not to generate a product checklist, is given the option to 1) return to step 302 (FIG. 3) to begin a new design or edit or review an old design, 2) return to step 304 (FIG. 3) to add or modify attributes in the existing scorecard, or 3) exit the program.

The above-described system for collecting, storing and retrieving guidance information related to product design and manufacturing activities enables a user to view and reference a previously unavailable quantity of information specifically related to the product being designed/manufactured at various stages during the design process. In this manner, efficiency and speed of the design/manufacturing process can be maximized.

The various computers and servers may be any appropriate type of computing and/or data entry device, such as a personal computer, a mainframe computer, a thin client, (e.g., an Internet appliance) a data terminal, or a portable device. The various functions can be implemented as software commands on the computers as servers. While the storage and data entry of the preferred embodiment are accomplished on separate computers/servers, the various functions can be accomplished by one or more computers. For example server 112 (FIG. 1) can accomplish the storage, data entry, computational, and display functions, as a stand alone or networked device, i.e., the entry computer, the server and the user computer can be one computer.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A method for saving and retrieving process capability and guidance information related to supporting product design and manufacturing activities, comprising the steps of:

receiving, from an information entry computer, process capability and guidance information, storing said process capability and guidance information in a first database, receiving, from a user computer associated with a system user, at least two attributes describing one of the group consisting of a product and a design process, wherein said attributes correspond to attributes included in said process capability and guidance information, retrieving, from said first database, at least one of the group consisting of a set of guidance information and process capability information relating to the attributes, displaying, on the user computer, at least a portion of said at least one of the group consisting of said retrieved set of guidance information and process capability information, segmenting said first field of said database record into a plurality of first sub-fields, each first sub-field corresponding to a particular part or process attribute, segmenting said second field of said database record into a second sub-field and a third sub-field, storing process capability information corresponding to a predetermined process capability model in said second sub-field, and storing guidance information corresponding to particular combinations of part or process attributes in said third sub-field.

2. The method of claim 1, further comprising the steps of:

segmenting said second sub-field into at least one set of a fourth sub-field and a fifth sub-field, storing process capability trigger attribute information in said fourth sub-field, and storing process capability output information in said fifth sub-field, wherein said process capability output information corresponds to said process capability trigger attribute information stored in said fourth sub-field.

3. The method of claim 1 further comprising the steps:

segmenting said third sub-field into at least one set of a sixth sub-field, a seventh sub-field, an eighth sub-field, a ninth sub-field, and a tenth sub-field, storing guidance trigger attribute information in said sixth sub-field, storing a criticality indicator in said seventh sub-field, wherein said criticality indicator describes relative importance of the corresponding guidance information, storing descriptive guidance information in said eighth sub-field storing reference information relating to said descriptive guidance information in said ninth sub-field, and storing outside network link information in said tenth sub-field.

4. A method for saving and retrieving process capability and guidance information related to supporting product design and manufacturing activities, comprising the steps of:

receiving, from an information entry computer, process capability and guidance information, storing said process capability and guidance information in a first database, receiving, from a user computer associated with a system user, attributes describing one of the group consisting of a product and a design process, wherein said attributes correspond to attributes included in said process capability and guidance information, retrieving, from said first database, at least one of the group consisting of a set of guidance information and process capability information relating to the attributes, displaying, on the user computer, at least a portion of said at least one of the group consisting of said retrieved set of guidance information and process capability information, receiving, from the user computer, a request to save at least one of the group consisting of said retrieved set of design guidance information and process capability information, and saving at least one of the group consisting of said retrieved set of design guidance information and process capability information in a second database, said saving including appending said at least one of the group consisting of said retrieved set of guidance information and process capability information onto at least one of the group consisting of a previously saved set of guidance information and process capability information to create a collection of retrieved information.

5. The method of claim 4 further comprising the steps of:

receiving, from the user computer, a request to view a previously saved collection of retrieved information, retrieving, from the second database, said previously saved collection of retrieved information, and displaying, to the user computer, at least a portion of said previously saved collection of retrieved information.

6. The method of claim 5 wherein the step of displaying said previously saved collection includes the step of generating a scorecard listing at least a portion of said previously saved collection of retrieved information suitable for printing by said system user.

7. The method of claim of claim 6 further comprising the steps of:

ranking one of the group consisting of said retrieved set of guidance information and process capability information in order of importance, generating a checklist incorporating said portion of said at least one of the group consisting of said retrieved set of guidance information and process capability information, wherein said checklist includes a ranked listing of guidance information, and displaying, on the user computer, at least a portion of said generated checklist.

8. The method of claim 4, wherein said output guidance information relates to guidance information selected from the group consisting of design guidance information for aiding a product designer in designing a particular part, process guidance information for aiding a product manufacturer in manufacturing the particular part, and sourcing guidance information for aiding a product scheduler in sourcing manufacture of the particular part, and combinations thereof.

9. A method for saving and retrieving process capability and guidance information related to supporting product design and manufacturing activities, comprising the steps of:

receiving, from an information entry computer, process capability and guidance information, wherein the guidance information is selected from the group consisting of design guidance information for aiding a product designer in designing a particular part, process guidance information for aiding a product manufacturer in manufacturing the particular part, and sourcing guidance information for aiding a product scheduler in sourcing manufacture of the particular part, and combinations thereof, storing said process capability and guidance information in a first database, receiving, from a user computer associated with a system user, attributes describing one of the group consisting of a product and a design process, wherein said attributes correspond to attributes included in said process capability and guidance information, retrieving, from said first database, at least one of the group consisting of a set of guidance information and process capability information relating to the attributes, and displaying, on the user computer, at least a portion of said at least one of the group consisting of said retrieved set of guidance information and process capability information, receiving, from the user computer, an indication regarding a selected type of guidance information to display, and displaying, to the user computer, only the selected type of guidance information from the group consisting of the retrieved set of guidance information and process capability information.

10. A computer readable medium to be used on a server in communication with a plurality of user computers, the medium having computer readable code comprising:

(a) instructions for receiving, from an information entry computer, process capability and guidance information, (b) instructions for storing said process capability and guidance information in a first database, wherein said instructions for storing comprising:

(i) instructions for creating at least one database record having a plurality of fields corresponding respectively, to various types of process capability and guidance information, wherein said at least one database record corresponds to a predefined collection of process capability and guidance information, (ii) instructions for storing attribute information corresponding to a standardized set of part and process attributes in a first field of said database record, and (iii) instructions for storing output guidance information in a second field of said database record, (c) instructions for receiving, from a user computer, attributes describing a product or design process, wherein said attributes correspond to attributes included in said process capability and guidance information, (d) instructions for retrieving, from said first database, at least one type of information from a set consisting of guidance information and process capability information relating to the attributes, (e) instructions for displaying, on the user computer, at least a portion of the information retrieved from said first database information, (f) instructions for segmenting said first field of said database record into a plurality of first sub-fields, each first sub-field corresponding to a particular one of part and process attributes, (g) instructions for segmenting said second field of said database record into a second sub-field and a third sub-field, (h) instructions for storing process capability information corresponding to a predetermined process capability model in said second sub-field, and (i) instructions for storing guidance information corresponding to particular combinations of part and process attributes in said third sub-field.

11. The computer readable medium of claim 10, wherein said output guidance information relates to guidance information selected from the group consisting of design guidance information for aiding a product designer in designing a particular part, process guidance information for aiding a product manufacturer in manufacturing the particular part, and sourcing guidance information for aiding a product scheduler in sourcing manufacture of the particular part, and combinations thereof.

12. The computer readable medium of claim 10 further comprising:

instructions for segmenting said second sub-field into at least one set of a fourth sub-field and a fifth sub-field, instructions for storing process capability trigger attribute information in said fourth sub-field, and instructions for storing process capability output information in said fifth sub-field, wherein said process capability output information corresponds to said process capability trigger information stored in said fourth sub-field.

13. The computer readable medium of claim 12 further comprising:

instructions for segmenting said third sub-field into at least one set of a sixth sub-field, a seventh sub-field, an eighth sub-field, a ninth sub-field, and a tenth sub-field, instructions for storing guidance trigger attribute information in said sixth sub-field, instructions for storing a criticality indicator in said seventh sub-field, wherein said criticality indicator describes relative importance of the corresponding guidance information, instructions for storing descriptive guidance information in said eighth sub-field, instructions for storing reference information relating to said descriptive guidance information in said ninth sub-field, and instructions for storing outside network link information in said tenth sub-field.

14. A computer readable medium to be used on a server in communication with a plurality of user computers, the medium having computer readable code comprising:

instructions for receiving, from an information entry computer, process capability and guidance information, instructions for storing said process capability and guidance information in a first database, instructions for receiving, from a user computer, attributes describing a product or design process, wherein said attributes correspond to attributes included in said process capability and guidance information, instructions for retrieving, from said first database, at least one type of information from a set consisting of guidance information and process capability information relating to the attributes, instructions for displaying, on the user computer, at least a portion of the information retrieved from said first database information, instructions for receiving, from the user computer, a request to save the at least one type of information retrieved from the set consisting of guidance information and process capability information, and instructions for saving at least one type of information retrieved from a set consisting of guidance information and process capability information in a second database, wherein the instructions for saving include instructions for appending the at least one type of information retrieved from the set consisting of guidance information and process capability information onto a previously saved set of guidance information and process capability information to create a collection of retrieved information.

15. The computer readable medium of claim 14 further comprising:

instructions for receiving, from the user computer, a request to view a previously saved collection of retrieved information, instructions for retrieving, from the second database, said previously saved collection of retrieved information, and instructions for displaying, on the user computer, at least a portion of said previously saved collection of retrieved information.

16. The computer readable medium of claim 15 wherein the instructions for displaying said previously saved collection include instructions for generating a scorecard listing at least a portion of said previously saved collection of retrieved information suitable for printing by said system.

17. The computer readable medium of claim 16 further comprising:

instructions for ranking the information retrieved from the set consisting of guidance information and process capability information in order of importance, instructions for generating a checklist incorporating the information retrieved from the set consisting of guidance information and process capability information, wherein said checklist includes a ranked listing of guidance information, and instructions for displaying, on the user computer, at least a portion of the generated checklist.

18. A system for enabling individual users to save and retrieve process capability and guidance information related to supporting product design and manufacturing activities, comprising:

a computer network, a server coupled to said computer network, an information entry computer coupled to the computer network for delivering process capability and guidance information to said server, said server including a first database for storing said process capability and guidance information, and a user computer for use by one of the individual users, coupled to the computer network for delivering attributes describing one of the group consisting of a product and a design process and corresponding to attributes included in said process capability and guidance information, wherein said server, upon receipt of said attributes, is adapted to retrieve from said first database a set of one of the group consisting of guidance information and process capability information relating to the attributes included in said process capability and guidance information, wherein said user computer is adapted to display at least a portion of said retrieved set of guidance information and process capability information, and wherein a first field of said database record comprises a plurality of first sub-fields, each first sub-field corresponding, respectively, to a particular part or process attribute, and a second field of said database record comprises respectively, a second sub-field and a third sub-field, wherein process capability information corresponding to a predetermined process capability model is stored in said second sub-field, and wherein guidance information corresponding to particular combinations of part or process attributes is stored in a third sub-field.

19. The system of claim 18, wherein said output guidance information relates to guidance information selected from the group consisting of design guidance information for aiding a product designer in designing a particular part, process guidance information for aiding a product manufacturer in manufacturing the particular part, and sourcing guidance information for aiding a product scheduler in sourcing manufacture of the particular part, and combinations thereof.

20. The system of claim 18 wherein said second sub-field comprises at least one set of a fourth sub-field and a fifth sub-field, said fourth sub-field being adapted to store process capability trigger attribute information, and said fifth sub-field field being adapted to store process capability output information, wherein said process capability output information corresponds to said process capability trigger information.

21. The system of claim 18 wherein said third sub-field comprises at least one set of a sixth sub-field, a seventh sub-field, an eighth sub-field, a ninth sub-field, and a tenth sub-field, wherein guidance trigger attribute information is stored in said sixth sub-field, and a criticality indicator is stored in said seventh sub-field, said criticality indicator being adapted to describe relative importance of the corresponding guidance information, and wherein said eighth sub-field is adapted to store descriptive guidance information, said ninth sub-field is adapted to store reference information relating to said descriptive guidance information, and said tenth sub-field is adapted to store outside network link information.

22. A system for enabling individual users to save and retrieve process capability and guidance information related to supporting product design and manufacturing activities, comprising:

a computer network, a server coupled to said computer network, an information entry computer coupled to the computer network for delivering process capability and guidance information to said server, said server including a first database for storing said process capability and guidance information, and a user computer for use by one of the individual users, coupled to the computer network for delivering attributes describing one of the group consisting of a product and a design process and corresponding to attributes included in said process capability and guidance information, wherein said server, upon receipt of said attributes, is adapted to retrieve from said first database a set of one of the group consisting of guidance information and process capability information relating to the attributes included in said process capability and guidance information, wherein said user computer is adapted to display at least a portion of said retrieved set of guidance information and process capability information, wherein said server includes a second database and is operative to receive, from the user computer, a request to save said retrieved set of guidance information and process capability information and to save said retrieved set of guidance information and process capability information in said second database, and wherein said server is operative to receive, from the user computer, a request to view a previously saved collection of retrieved information, to retrieve, from the second database, the previously saved collection of retrieved information, and to display, on the user computer, at least a portion of said previously saved collection of retrieved information.

23. The system of claim 22 wherein said server is operative to rank said retrieved set of guidance information and process capability information in order of importance, to generate a checklist incorporating said portion of said retrieved set of guidance information and process capability information, said checklist including a ranked listing of guidance information, and to display, on the user computer, at least a portion of the generated checklist.

* * * * *